(12) United States Patent
Lee et al.

(10) Patent No.: US 9,570,524 B2
(45) Date of Patent: Feb. 14, 2017

(54) FLEXIBLE ORGANIC LIGHT EMITTING DIODE DISPLAY PANEL

(71) Applicant: LG Display Co., Ltd., Seoul (KR)

(72) Inventors: JongKyun Lee, Goyang-si (KR); YongChul Kim, Paju-si (KR); Haeyeon Jeong, Osan-si (KR); SeungHee Kuk, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/830,224

(22) Filed: Aug. 19, 2015

(65) Prior Publication Data

US 2016/0064461 A1    Mar. 3, 2016

(30) Foreign Application Priority Data

Aug. 31, 2014 (KR) .................. 10-2014-0114821

(51) Int. Cl.
*H01L 27/32* (2006.01)
*H01L 51/00* (2006.01)

(52) U.S. Cl.
CPC ....... *H01L 27/3246* (2013.01); *H01L 51/0097* (2013.01); *H01L 2251/5338* (2013.01)

(58) Field of Classification Search
CPC ...... H01L 27/32; H01L 51/00; H01L 27/3246; H01L 27/3223; H01L 51/0097; H01L 51/5259

See application file for complete search history.

(56) References Cited

U.S. PATENT DOCUMENTS

| | | | | |
|---|---|---|---|---|
| 2009/0267059 A1* | 10/2009 | Park | ................... | H01L 27/3223 257/40 |
| 2009/0278449 A1* | 11/2009 | Choi | ................... | H01L 27/3244 313/504 |
| 2015/0087093 A1* | 3/2015 | Sakano | ............... | H01L 51/0024 438/27 |
| 2015/0179719 A1* | 6/2015 | Nam | ................... | H01L 27/3246 257/40 |
| 2015/0279915 A1* | 10/2015 | Morita | ................ | H01L 27/3213 257/88 |

* cited by examiner

*Primary Examiner* — Phuc Dang
(74) *Attorney, Agent, or Firm* — Fenwick & West LLP (57) ABSTRACT

Provided is a flexible organic light emitting diode display panel including: a substrate in which an opening region and a non-opening region are defined; an organic light emitting diode disposed on the substrate; a bank layer disposed in the non-opening region; and a peeling reduction layer having a reverse-tapered shape disposed in the non-opening region.

11 Claims, 6 Drawing Sheets

FLEXIBLE ORGANIC LIGHT EMITTING DIODE DISPLAY PANEL

CROSS-REFERENCE TO RELATED APPLICATIONS

This application claims the priority under 35 U.S.C §119(a) to Korean Patent Application No. 10-2014-0114821 filed on Aug. 31, 2014, in the Korean Intellectual Property Office, the disclosure of which is incorporated herein by reference.

BACKGROUND

Field of Technology

The present disclosure relates to a flexible organic light emitting diode display panel, and more particularly, to a flexible organic light emitting diode display panel capable of minimizing peeling of an organic material layer and an encapsulation layer which may occur when a substrate is bent.

Description of the Related Art

An organic light emitting diode (OLED) display is a self-light emitting display panel that does not need a separate light source unlike a liquid crystal display (LCD) panel. Thus, the organic light emitting diode display panel can be manufactured into a lightweight and thin form. Further, the organic light emitting diode display panel is advantageous in terms of power consumption since it is driven with a low voltage. Also, the organic light emitting diode display panel has excellent color expression ability, a high response speed, a wide viewing angle, and a high contrast ratio (CR). Therefore, the organic light emitting diode display panel has been researched as a next-generation display.

Further, since the organic light emitting diode display panel does not need a separate light source, it is advantageous for curved and flexible display panels.

In the organic light emitting diode display panel, a pixel electrode connected with a thin film transistor, an organic light emitting layer, and a common electrode are formed on a substrate including the thin film transistor. The organic light emitting diode display panel is driven by emitting the organic light emitting layer in response to a driving signal of the thin film transistor.

The organic light emitting layer emits light when an electron and a hole injected from the pixel electrode and the common electrode meet in the organic light emitting layer and form an exciton.

Since the organic light emitting layer is sensitive particularly to moisture and oxygen, an encapsulation layer including one or more layers is formed on an organic light emitting diode in order to suppress permeation of moisture and oxygen.

In order to seal the organic light emitting diode, a thin film encapsulation technique of alternately laminating an inorganic material layer and an organic material layer is used.

As an inorganic material for a thin film encapsulation, an oxide layer such as aluminum oxide ($AlO_x$) capable of having an excellent barrier property with small thickness has been mainly used. In particular, as the thickness of the thin film encapsulation is decreased, the flexibility of the organic light emitting diode display panel is improved. Therefore, it is advantageous in using the oxide layer as the inorganic material layer for thin film encapsulation in order to realize a flexible organic light emitting diode display panel.

However, the organic light emitting layer tends to have lower adhesion than other components constituting the organic light emitting diode display panel. Thus, peeling of the flexible organic light emitting diode display panel may occur when the display panel is bent.

Further, peeling of the encapsulation layer may occur when the display panel is bent.

SUMMARY

As described above, when a flexible organic light emitting diode display panel is bent, peeling may occur in an organic light emitting layer or a thin film encapsulation layer of the panel.

When the flexible organic light emitting diode display panel is bent, a compressive stress is generated on one side and a tensile stress is generated on the other side. A weak portion of the components constituting the flexible organic light emitting diode display panel may have a crack or may peel off from a substrate.

Thus, the inventors of the present disclosure invented a new structure of a flexible organic light emitting diode display panel capable of reducing the compressive stress and the tensile stress applied to the flexible organic light emitting diode display panel.

An object to be achieved by the present disclosure is to provide a flexible organic light emitting diode display panel capable of reducing a bending stress which causes the peeling of an organic light emitting layer.

Another object to be achieved by the present disclosure is to provide a flexible organic light emitting diode display panel improved in reliability for a flexible environment by minimizing the peeling of an organic light emitting layer and an encapsulation layer.

The objects of the present disclosure are not limited to the aforementioned objects, and other objects, which are not mentioned above, will be apparent to a person having ordinary skill in the art from the following description.

According to an aspect of the present disclosure, there is provided a flexible organic light emitting diode display panel including: a substrate in which an opening region and a non-opening region are defined; an organic light emitting diode disposed on the substrate; a bank layer disposed in the non-opening region; and a peeling reduction layer having a reverse-tapered shape disposed in the non-opening region.

According to another feature of the present disclosure, the peeling reduction layer may be disposed on the bank layer.

According to yet another feature of the present disclosure, a distance between the adjacent opening regions may be the same as a distance between the adjacent peeling reduction layers.

According to still another feature of the present disclosure, the peeling reduction layer may have a zigzag shape.

According to still another feature of the present disclosure, the peeling reduction layer may have one shape selected from a triangle wave shape, a sine wave shape, and a pulse wave shape.

According to still another feature of the present disclosure, the substrate may include a thin film transistor. Also, the organic light emitting diode may include a pixel electrode connected with the thin film transistor, an organic light emitting layer, and a common electrode.

According to still another feature of the present disclosure, the common electrode may be disposed to cover a side surface and a top surface of the peeling reduction layer.

According to still another feature of the present disclosure, the organic light emitting layer may have discontinued portions adjacent to the peeling reduction layer.

According to still another feature of the present disclosure, the flexible organic light emitting diode display panel may further include: an encapsulation layer disposed on the organic light emitting diode.

According to still another feature of the present disclosure, the encapsulation layer may be disposed to cover a side surface and a top surface of the peeling reduction layer.

According to still another feature of the present disclosure, the bank layer may include at least one hole, and the peeling reduction layer may be inserted into the hole.

According to still another feature of the present disclosure, a depth of the hole may correspond to a height of the bank layer.

According to still another feature of the present disclosure, the depth of the hole may be lower than the height of the bank layer.

Details of other exemplary embodiments will be included in the detailed description of the disclosure and the accompanying drawings.

A flexible organic light emitting diode display panel according to an exemplary embodiment of the present disclosure includes a peeling reduction layer. Thus, even in an environment where the flexible organic light emitting diode display panel is bent, the peeling of an organic light emitting layer or an encapsulation layer can be minimized. Therefore, there is an effect of improving the reliability of the organic light emitting diode.

The effects of the present disclosure are not limited to the aforementioned effects, and other effects, which are not mentioned above, will be apparent to a person having ordinary skill in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 1A:
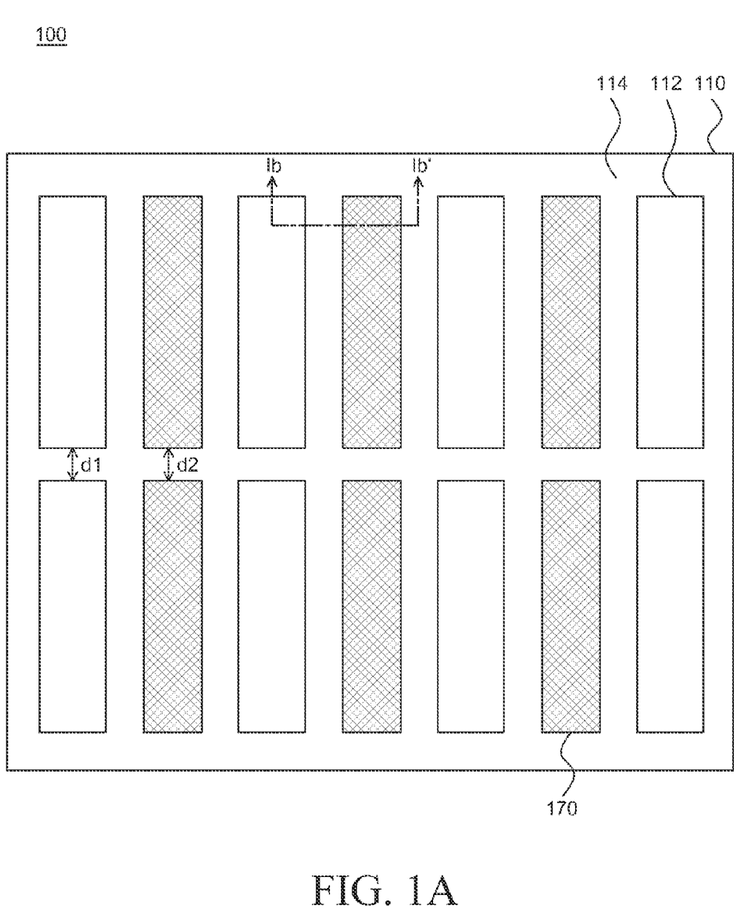
FIG. 1A is a schematic plan view of a flexible organic light emitting diode display panel according to an exemplary embodiment of the present disclosure.

FIG. 1A is a schematic plan view of a flexible organic light emitting diode display panel according to an exemplary embodiment of the present disclosure.

Referring to FIG. 1A, a flexible organic light emitting diode display panel 100 according to an exemplary embodiment of the present disclosure includes a substrate 110 and a peeling reduction layer 170.

The substrate 110 is configured to support various components of the flexible organic light emitting diode display panel 100. The substrate 110 may be formed of a material having transparency and flexibility.

The substrate 110 includes one or more opening regions 112 and a non-opening region 114. The opening region 112 refers to a region configured to emit light, and the non-opening region 11 refers to a region configured not to emit light.

The peeling reduction layer 170 is disposed in the non-opening region 114. The peeling reduction layer 170 of the flexible organic light emitting diode display panel 100 according to an exemplary embodiment of the present disclosure has a stripe shape. As illustrated in FIG. 1A, a minimum distance d1 between the adjacent opening regions 112 may be the same as a minimum distance d2 between the adjacent peeling reduction layers 170. The peeling reduction layer 170 will be described in more detail with reference to FIG. 1B.

Figure 1B:
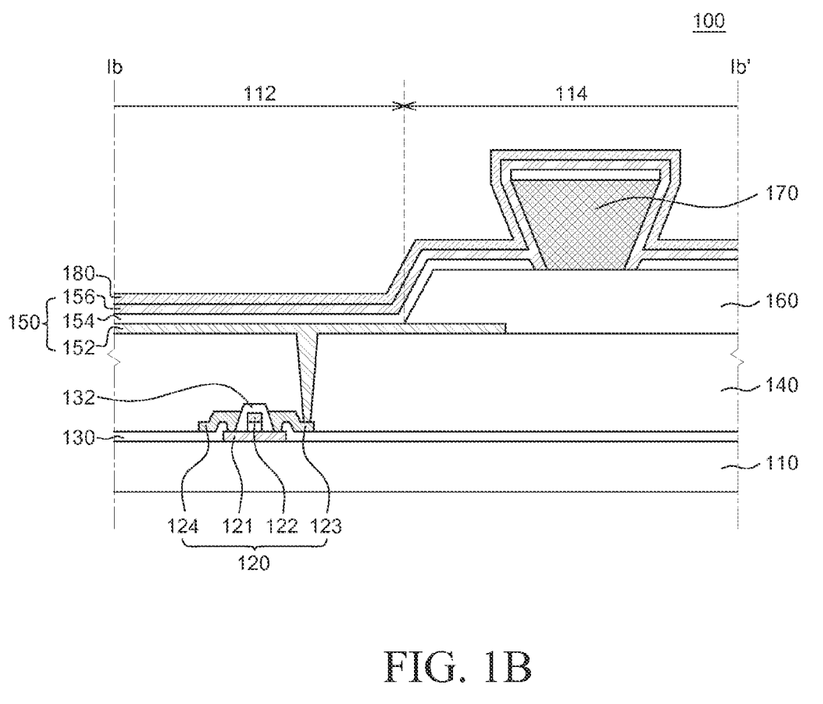
FIG. 1B is a cross-sectional view of the flexible organic light emitting diode display panel taken along a line Ib-Ib' of FIG. 1A.

FIG. 1B is a cross-sectional view of the flexible organic light emitting diode display panel taken along a line Ib-Ib' of FIG. 1A.

Referring to FIG. 1B, the flexible organic light emitting diode display panel 100 according to an exemplary embodiment of the present disclosure includes the substrate 110, a thin film transistor 120, a gate insulation layer 130, an interlayer insulation layer 132, a planarization layer 140, an organic light emitting diode 150, a bank layer 160, a peeling reduction layer 170, and an encapsulation layer 180.

The thin film transistor 120 is disposed on the substrate 110. As illustrated in FIG. 1B, the thin film transistor 120 includes an active layer 121, a gate electrode 122, a source electrode 123, and a drain electrode 124. To be specific, the active layer 121 is formed on the substrate 110; the gate insulation layer 130 configured to insulate the active layer 121 from the gate electrode 122 is formed on the active layer 121; the gate electrode 122 is formed on the gate insulation layer 130 so as to be overlapped with the active layer 121; the interlayer insulation layer 132 is formed on the gate electrode 122 and the gate insulation layer 130; and the source electrode 123 and the drain electrode 124 are formed on the interlayer insulation layer 132. The source electrode 123 and the drain electrode 124 are electrically connected with the active layer 121. In the present specification, among various thin film transistors which can be included in the flexible organic light emitting diode display panel 100, only a driving thin film transistor is illustrated for convenience in explanation. Further, in the present specification, the thin film transistor 120 is illustrated as having a coplanar structure, but a thin film transistor having an inverted staggered structure may be used.

The planarization layer 140 is disposed on the thin film transistor 120. The planarization layer 140 is configured to flatten an upper part of the substrate 110 and may also be referred to as an overcoating layer. The planarization layer 140 includes a contact hole for electrically connecting the source electrode 123 of the thin film transistor 120 with a pixel electrode 152.

The organic light emitting diode 150 is disposed on the planarization layer 140. As illustrated in FIG. 1B, the organic light emitting diode 150 includes the pixel electrode 152, an organic light emitting layer 154, and a common electrode 156.

The pixel electrode 152 is configured to apply voltage to the organic light emitting layer 154. The pixel electrode 152 may be formed of a transparent conductive material having a high work function and a reflective plate. Herein, the transparent conductive material may include indium tin oxide (ITO), indium zinc oxide (IZO), and indium tin zinc oxide (ITZO).

The organic light emitting layer 154 is disposed on the pixel electrode 152. The organic light emitting layer 154 is configured to receive voltage from the pixel electrode 152 and the common electrode 156 and emit light. The organic light emitting layer 154 may be configured to emit white light. The organic light emitting layer 154 is formed to be extended to an upper part of the bank layer 160 and the peeling reduction layer 170. However, the organic light emitting layer 154 has a discontinuous portion in a reverse-tapered portion of the peeling reduction layer 170. That is, the organic light emitting layer 154 is discontinued by the peeling reduction layer 170. Since the organic light emitting layer 154 is discontinued, as illustrated in FIG. 1B, the organic light emitting layer 154 may be disposed on the top surface of the bank layer 160 and the peeling reduction layer 170 but may not be disposed on a side surface of the peeling reduction layer 170. The organic light emitting layer 154 is generally formed by upward deposition using a metal mask in order to minimizing impurities or the like. In this case, the organic light emitting layer 154 is disposed as having the discontinuous portion in the reverse-tapered portion of the peeling reduction layer 170 due to a limit of a step coverage caused by deposition. Since the organic light emitting layer 154 has the discontinuous portion, unintended emission of the organic light emitting layer 154 can be minimized and the mixing of colors between pixels of the flexible organic light emitting diode display panel 100 can be suppressed.

The common electrode 156 is disposed on the organic light emitting layer 154. The common electrode 156 is disposed to face the pixel electrode 152 and configured to apply voltage to the organic light emitting layer 154. The common electrode 156 is formed to have the very small thickness, and, thus, may be substantially transparent. The common electrode 156 may be formed of a metallic material having a low work function, such as silver (Ag), titanium (Ti), aluminum (Al), molybdenum (Mo), or an alloy of silver (Ag) and magnesium (Mg). Further, the common electrode 156 may be formed into a transparent common electrode using a material such as ITO, and IZO. As illustrated in FIG. 1B, the common electrode 156 is disposed as one body in all of the opening region 112 and the non-opening region 114, and may not be cut off by the peeling reduction layer 170. As a result, the common electrode 156 may be disposed to cover all of the top surface and the side surface of the peeling reduction layer 170 in the non-opening region 114.

The bank layer 160 is disposed to cover an edge of the pixel electrode 152. The bank layer 160 is disposed in the non-opening region 114, and configured to separate adjacent sub-pixel regions. The bank layer 160 may be formed of a transparent organic insulation material, for example, any one of polyimide, photo acryl, and benzocyclobutene (BCB), or a black material, for example, black resin.

The peeling reduction layer 170 is disposed on the bank layer 160. As illustrated in FIG. 1B, the peeling reduction layer 170 is disposed in the non-opening region 114 and has a reverse-tapered shape. The peeling reduction layer 170 is configured to increase a contact area between a component of the flexible organic light emitting diode display panel 100 and the encapsulation layer 180 in order to reduce the peeling of the components (e.g., the organic light emitting layer 154) disposed in the non-opening region 114 caused by bending of the flexible organic light emitting diode display panel 100. Further, the peeling reduction layer 170 is configured to secure a distance between the substrate 110 and the metal mask, i.e., configured as a spacer. The securing of a distance is to form the organic light emitting layer 154 in uniform thickness when the organic light emitting layer 154 is disposed on the substrate 110 by using the metal mask.

The encapsulation layer 180 is disposed on the peeling reduction layer 170. The encapsulation layer 180 is configured to minimize permeation of oxygen, moisture, and the like, into the organic light emitting layer 154 from the outside of the flexible organic light emitting diode display panel 100. In order to minimize permeation of oxygen, moisture, and the like, the encapsulation layer 180 may have a structure in which one or more inorganic material layers and one or more organic material layers are alternately laminated. As illustrated in FIG. 1B, the encapsulation layer 180 may be disposed to cover all of the top surface and the side surface of the peeling reduction layer 170.

In a conventional flexible organic light emitting diode display panel, a bank layer, an organic light emitting layer, a common electrode, and an encapsulation layer are disposed in a non-opening region. Herein, since the organic light emitting layer is generally disposed by a thermal deposition method, adhesion between the organic light emitting layer and the bank layer is considerably reduced. As a result, when the flexible organic light emitting diode display panel is repeatedly bent, the components, particularly the organic light emitting layer, present in the non-opening region may peel off. Further, if the encapsulation layer is disposed to have small thickness in order to secure the flexibility of the flexible organic light emitting diode display panel, the encapsulation layer frequently peels off by repeated bending.

In the flexible organic light emitting diode display panel 100 according to an exemplary embodiment of the present disclosure, the peeling reduction layer 170 having a reverse-tapered shape is disposed in the non-opening region 114. Therefore, in the non-opening region 114, the encapsulation layer 180 can secure a wider contact area while being in sufficient contact with the components of the flexible organic light emitting diode display panel 100. For example, as illustrated in FIG. 1B, in the non-opening region 114, the encapsulation layer 180 secures a wider contact area while being disposed to cover all of the top surface and the side surface of the peeling reduction layer 170. As a result, it is possible to minimize the peeling of the components, particularly the organic light emitting layer 154 and the encapsulation layer 180, of the flexible organic light emitting diode display panel 100 when the flexible organic light emitting diode display panel 100 is repeatedly bent.

Meanwhile, although not illustrated in FIG. 1A, a black matrix configured to suppress the mixing of colors of lights emitted from the opening region 112 may be further disposed in the non-opening region 114.

Figure 2:
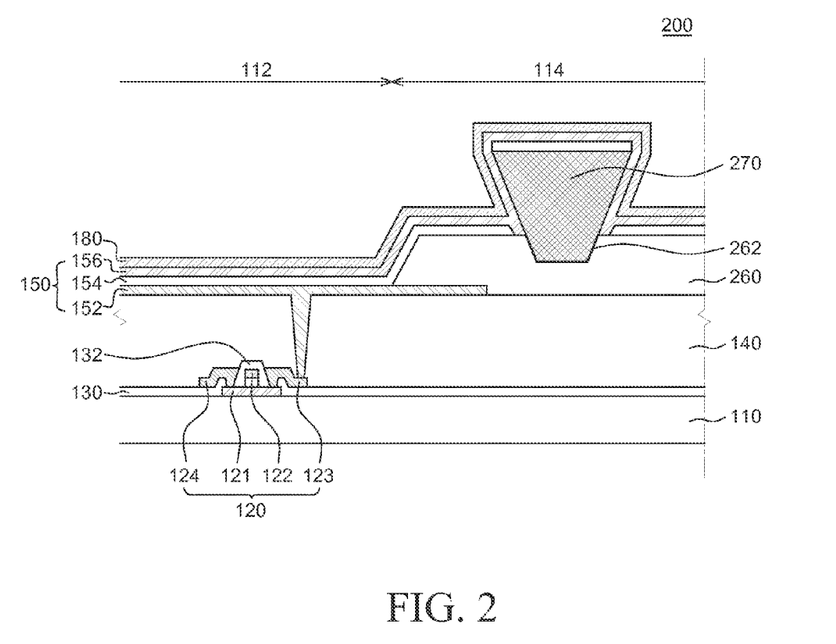
FIG. 2 is a schematic cross-sectional view of a flexible organic light emitting diode display panel according to another exemplary embodiment of the present disclosure.

FIG. 2 is a schematic cross-sectional view of a flexible organic light emitting diode display panel according to another exemplary embodiment of the present disclosure. A flexible organic light emitting diode display panel 200 illustrated in FIG. 2 is substantially the same as the flexible organic light emitting diode display panel 100 illustrated in FIG. 1. Except, a hole 262 is further included and a peeling reduction layer 270 is inserted into the hole 262. Therefore, redundant explanation thereof will be omitted.

Referring to FIG. 2, a bank layer 260 includes the hole 262. A depth of the hole 262 is lower than a height of the bank layer 260. Herein, the peeling reduction layer 270 having a reverse-tapered shape is disposed to be inserted into the hole 262 of the bank layer 260.

In the flexible organic light emitting diode display panel 200 according to another exemplary embodiment of the present disclosure, the peeling reduction layer 270 is inserted into the hole 262 of the bank layer 260. Thus, it is possible to minimize separation between the peeling reduction layer 270 and the bank layer 260 caused by repeated bending of the flexible organic light emitting diode display panel 200.

Figure 3:
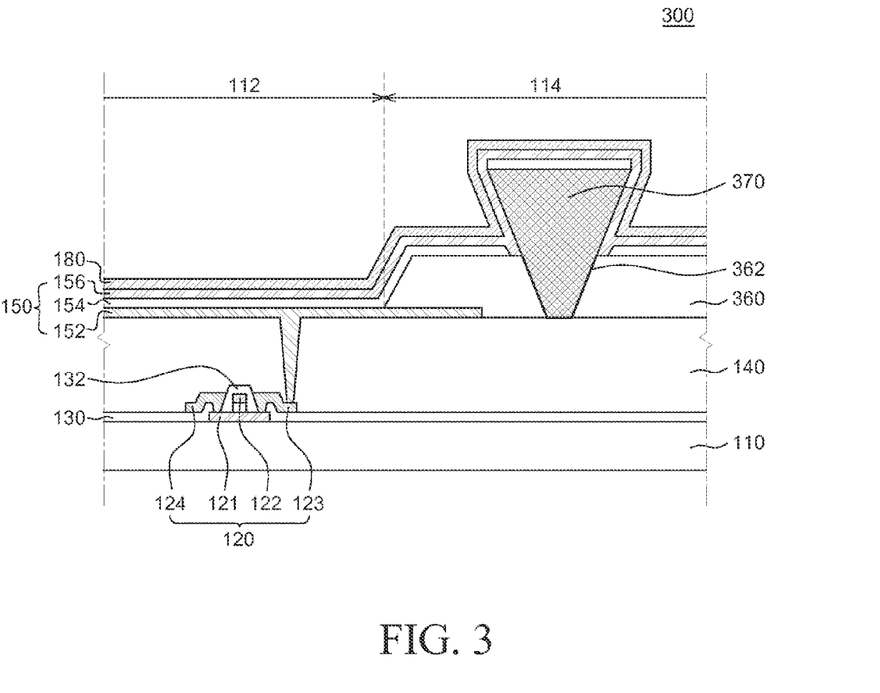
FIG. 3 is a schematic cross-sectional view of a flexible organic light emitting diode display panel according to yet another exemplary embodiment of the present disclosure.

FIG. 3 is a schematic cross-sectional view of a flexible organic light emitting diode display panel according to yet another exemplary embodiment of the present disclosure. A flexible organic light emitting diode display panel 300 illustrated in FIG. 3 is substantially the same as the flexible organic light emitting diode display panel 200 illustrated in FIG. 2 except for a depth of a hole 362. Therefore, redundant explanation thereof will be omitted.

Referring to FIG. 3, a bank layer 360 includes the hole 362, and the peeling reduction layer 370 is inserted into the hole 362. Herein, a depth of the hole 362 corresponds to a height of the bank layer 160.

In the flexible organic light emitting diode display panel 300 according to yet another exemplary embodiment of the present disclosure, the peeling reduction layer 370 is completely inserted into the hole 362. Thus, it is possible to further minimize the separation between the peeling reduction layer 370 and the bank layer 360 caused by repeated bending of the flexible organic light emitting diode display panel 300.

Figure 4A:
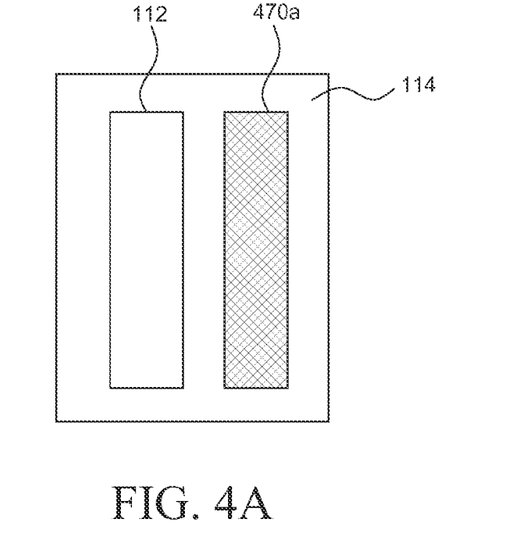
FIG. 4A to FIG. 4D are diagrams of exemplary embodiments provided for describing various shapes of a peeling reduction layer of the present disclosure.
Figure 4B:
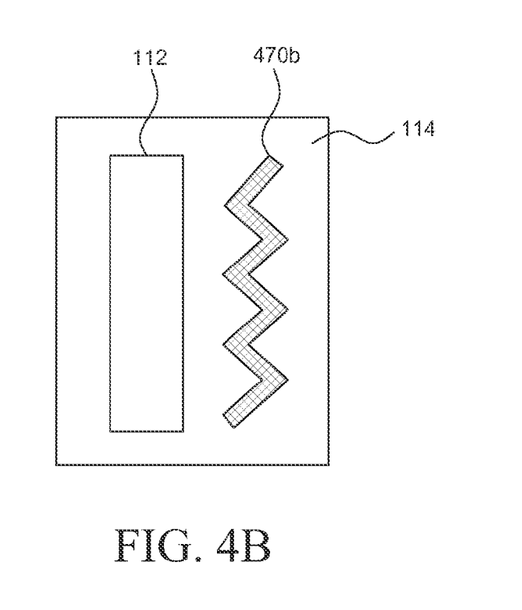
Figure 4C:
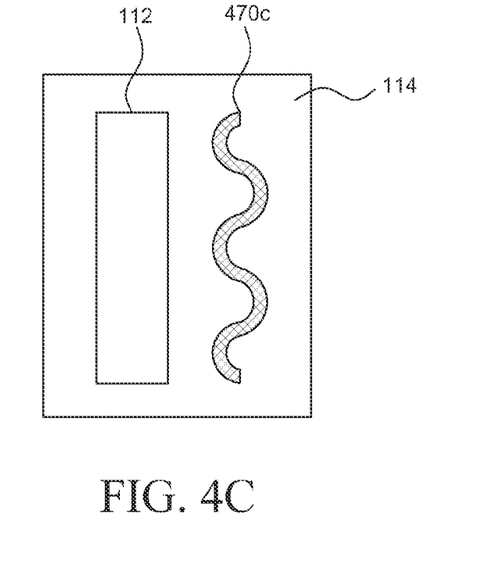
Figure 4D:
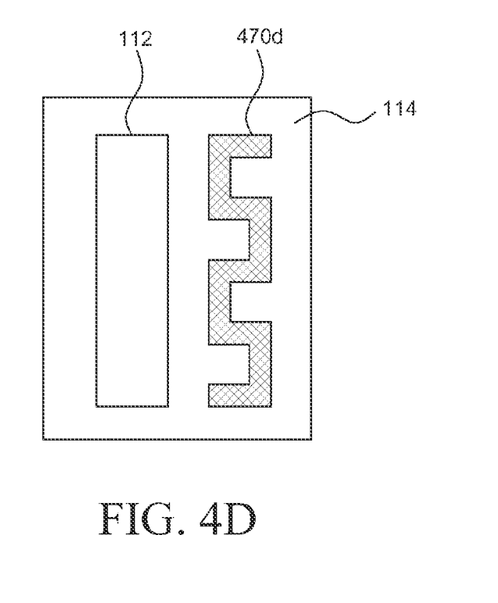

FIG. 4A to FIG. 4D are diagrams of exemplary embodiments provided for describing various shapes of a peeling reduction layer of the present disclosure. To be more specific, FIG. 4A is a schematic plan view of a flexible organic light emitting diode display panel including a stripe-shaped peeling reduction layer 470a which has the same shape as the peeling reduction layer 170 of FIG. 1A; FIG. 4B is a schematic plan view of a flexible organic light emitting diode display panel including a triangle wave-shaped peeling reduction layer 470b; FIG. 4C is a schematic plan view of a flexible organic light emitting diode display panel including a sine wave-shaped peeling reduction layer 470c; and FIG. 4D is a schematic plan view of a flexible organic light emitting diode display panel including a pulse wave-shaped peeling reduction layer 470d.

Unlike the peeling reduction layer 470a illustrated in FIG. 4A, the peeling reduction layers 470b, 470c, and 470d respectively illustrated in FIG. 4B to FIG. 4D have a zigzag shape. To be specific, the peeling reduction layer 470b illustrated in FIG. 4B has a triangle wave shape. The peeling reduction layer 470c illustrated in FIG. 4C has a sine wave shape, and the peeling reduction layer 470d illustrated in FIG. 4D has a pulse wave shape. If the peeling reduction layers 470b, 470c, and 470d have a zigzag shape, the encapsulation layer 180 can be brought into contact with the peeling reduction layers 470b, 470c, and 470d with a wider contact area in the non-opening region 114. Therefore, it is possible to further minimize the peeling of the components, particularly the organic light emitting layer 154 and the encapsulation layer 180, of the flexible organic light emitting diode display panel caused by repeated bending.

Further, if the peeling reduction layers 470b, 470c, and 470d have a zigzag shape, the peeling reduction layers 470b, 470c, and 470d are applied with less stress caused by bending. In this case, the peeling of the peeling reduction layers 470b, 470c, and 470d caused by bending can also be minimized Therefore, the reliability of the flexible organic light emitting diode display panel can be improved. This will be described in more detail with reference to the following experimental result.

The following Table 1 lists stress caused by bending to be applied to a peeling reduction layer of various shapes.

TABLE 1

| Shape | Stress (MPa) |
| --- | --- |
| Stripe | 2451 |
| Triangle | 1286 |
| Sine | 1993 |
| Pulse | 1676 |

In order to deduce the experimental result listed in Table 1, an experiment was conducted to the peeling reduction layers 470a, 470b, 470c, and 470d illustrated in FIG. 4A to FIG. 4D. Specifically, the stripe-shaped peeling reduction layer 470*a*, the triangle wave-shaped peeling reduction layer 470*b*, the sine wave-shaped peeling reduction layer 470*c*, and the pulse wave-shaped peeling reduction layer 470*d* were examined.

As an experimental condition, the peeling reduction layers 470*a*, 470*b*, 470*c*, and 470*d* of various shapes were formed on a substrate made of polyimide. The substrate is to have a thickness of 3.2 mm. Then, stress applied to the peeling reduction layers 470*a*, 470*b*, 470*c*, and 470*d* of various shapes was measured in the unit of Pascal while a substrate is bent to a radius of 0.4 mm.

Referring to Table 1, it can be seen that lower bending stresses are applied to the peeling reduction layers 470*b*, 470*c*, and 470*d* of a zigzag shape. Particularly, the lowest bending stress is applied to the triangle wave-shaped peeling reduction layer 470*b*. According to this result, it could be seen that the excellent bending reliability can be secured by disposing the peeling reduction layers 470*b*, 470*c*, and 470*d* of a zigzag shape, and more preferably, the triangle wave-shaped peeling reduction layer 470*b*.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible organic light emitting diode display panel comprising:
    a substrate in which an opening region and a non-opening region are defined;
    an organic light emitting diode disposed on the substrate;
    a bank layer disposed in the non-opening region;
    a peeling reduction layer having a reverse-tapered shape disposed in the non-opening region; and
    an encapsulation layer disposed on the organic light emitting diode,
    wherein the encapsulation layer is disposed to cover a side surface and a top surface of the peeling reduction layer.

2. The flexible organic light emitting diode display panel according to claim 1, wherein the peeling reduction layer is disposed on the bank layer.

3. The flexible organic light emitting diode display panel according to claim 1, wherein a distance between adjacent opening regions is the same as a distance between adjacent peeling reduction layers.

4. The flexible organic light emitting diode display panel according to claim 1, wherein the peeling reduction layer has a zigzag shape.

5. The flexible organic light emitting diode display panel according to claim 4, wherein the peeling reduction layer has one shape selected from a triangle wave shape, a sine wave shape, and a pulse wave shape.

6. The flexible organic light emitting diode display panel according to claim 1, wherein the substrate includes a thin film transistor, and
    the organic light emitting diode includes a pixel electrode connected with the thin film transistor, an organic light emitting layer, and a common electrode.

7. The flexible organic light emitting diode display panel according to claim 6, wherein the common electrode is disposed to cover a side surface and a top surface of the peeling reduction layer.

8. The flexible organic light emitting diode display panel according to claim 6, wherein the organic light emitting layer has discontinued portions adjacent to the peeling reduction layer.

9. The flexible organic light emitting diode display panel according to claim 1, wherein the bank layer includes at least one hole, and
    the peeling reduction layer is inserted into the at least one hole.

10. The flexible organic light emitting diode display panel according to claim 9, wherein a depth of the at least one hole corresponds to a height of the bank layer.

11. The flexible organic light emitting diode display panel according to claim 10, wherein the depth of the at least one hole is lower than the height of the bank layer.

* * * * *